Jan. 19, 1971 KARL-HEINZ GINSBACH ET AL 3,556,878

METHOD OF PRODUCING A THYRISTOR DEVICE

Original Filed Aug. 8, 1966

INVENTORS
Karl-Heinz Ginsbach &
Rigobert Schimmer

BY Spencer & Kaye

ATTORNEYS

United States Patent Office 3,556,878

Patented Jan. 19, 1971

3,556,878

METHOD OF PRODUCING A THYRISTOR DEVICE

Karl-Heinz Ginsbach and Rigobert Schimmer, Belecke (Mohne), Germany, assignors to Licentia Patent-Verwaltungs G.m.b.H., Frankfurt am Main, Germany Original application Aug. 8, 1966, Ser. No. 570,923. Divided and this application Sept. 19, 1967, Ser. No. 678,133

Claims priority, application Germany, Aug. 9, 1965, L 40,230, L 51,331

Int. Cl. H01l 7/34

U.S. Cl. 148—175 8 Claims

ABSTRACT OF THE DISCLOSURE

A method of making a thyristor by arranging a first layer of p-type conductivity upon all the surfaces of an n-type substrate, arranging a $p^+$ layer on all the surfaces of the p layer, removing part of the $p^+$ layer to expose a portion of the p layer and arranging n-type layer on the exposed portion of the p layer.

Figure 1A:
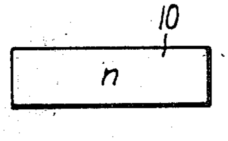

The present application is a division of our copending application Ser. No. 570,923, filed Aug. 8, 1966.

The present invention relates to a new and improved thyristor device and to a new and improved method for producing the device. More particularly, the present invention relates to a thyristor device having improved operational characteristics and to a method for producing such device.

A thyristor is generally a silicon controlled rectifier, constructed in four layers called the cathode, gate, base and anode regions. The layers are generally alternating n and p conductivity types. It will conduct a substantial amount of current in the forward direction only after the anode voltage exceeds a certain minimum "forward breakover voltage." This voltage can be varied by the introduction of an external signal at the gate electrode.

Such an apparatus can be fabricated by a series of process steps. The conventional process steps start with a uniformly doped silicon wafer which can be, for example, of n-type conductivity. In order to convert the silicon wafer into a thyristor structure, conventional methods next use a diffusion step. At the end of the diffusion step, the silicon wafer forms the core which is of n-conductivity but each part of its surface now has a layer of p-type material thereon. The p-type layer has a preselected thickness. The thickness or depth of the p-type layer depends on the particular diffusion conditions, such as the type of p-doping material, the temperature and the time during which the diffusion step is carried out.

At the end of this diffusion step, three of the required layers have been provided, namely the n-type wafer, which serves as the base, and the two p-type layers on respective major surface portions of the wafer which serve respectively as the gate and the anode. The fourth layer to produce the cathode is provided by the partial conversion of one side of the silicon wafer wherein an n-type layer is arranged on one part of the p-type layer already diffused into the n-type silicon wafer.

This last process step does not normally cover the entire extent of one side of the silicon wafer. For example, it can be carried out by an alloying step using gold-antimony. In many cases, the other side of the silicon wafer is simultaneously alloyed with an appropriate alloying material for a p-type material to provide a carrier plate such as molybdenum or tungsten. The molybdenum or tungsten plate serves subsequently in the mounting process as a basis for soldering connectors thereto.

Since the gate and anode regions in the prior art thyristors are formed in the same diffusion step, these regions have the same thickness. However, this is not the optimum arrangement for the various properties of the thryistor.

Accordingly, it is an object of the present invention, to provide a new and improved thyristor device.

A second object of the present invention is to provide a new and improved method for producing a thyristor device.

Another object of the present invention is to provide a new and improved thyristor device which has a concentration profile in its various regions to permit substantially optimum operating results.

A further object of the present invention is to provide a thyristor device having a concentration profile in its anode region which has substantially steeper portions than the concentration profile in its gate region.

With the above objects in view, the present invention mainly comprises a thyristor device having a cathode, a gate, a base and an anode wherein the concentration profile of the anode region has a substantially steeper portion than the concentration profile of the gate region.

The method incorporating the principles of the present invention produces a thyristor by starting with a wafer of semiconductor material having a first conductivity and includes the steps of arranging a first layer of opposite conductivity to said first conductivity on the surface of the wafer. A second layer is arranged on the first layer. The second layer is also of the opposite conductivity type but has a substantially heavier doping than the first layer. Part of the second layer is removed to leave an exposed portion of the first layer. Finally, a third layer of material of the first conductivity type is arranged on the exposed portion of the first layer.

Additional objects and advantages of the present invention will become apparent upon consideration of the following description when taken in conjunction with the accompanying drawings in which:

FIG. 1, including FIGS 1*a*–1*d*, shows the thyristor diagrammatically after the various process steps carried out in accordance with the principles of the present invention.

Figure 1B:
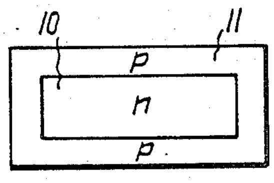
Figure 1C:
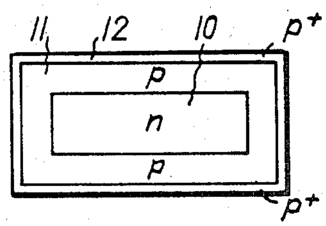
Figure 1D:
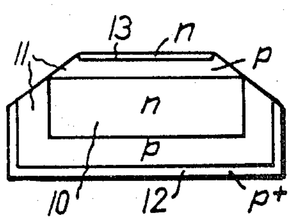
Figure 2:
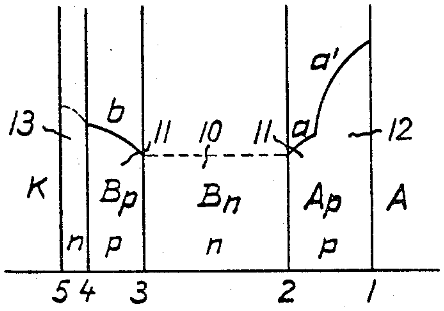

FIG. 2 is a graphical representation of the concentration profile throughout the various regions of the thyristor formed by the process steps of FIG. 1.

Referring now to the drawings and, more particularly, to FIG. 1, FIG. 1*a* shows a wafer 10 of semiconductive material. In the chosen example, the wafer 10 may be silicon and is chosen to have an n-type conductivity.

By means of a diffusion step, the wafer 10 is surrounded by a p-type layer 11 as shown in FIG. 1*b*. The diffusion step may be carried out in a gallium atmosphere, for example, in order to provide the p-type conductivity layer 11.

A more heavily doped p-type region 12 is shown arranged on the p-type layer 11 on FIG. 1*c*. The $p^+$ layer shown in FIG. 1*c* is provided by a gettering step using a halogen compound boron-tri-bromide, for example.

From the arrangement shown n FIG. 1*c*, the structure shown in FIG. 1*d* is produced. That is, the $p^+$ layer 12 adjacent the upper portion of the p-type layer 11, is lapped off while the $p^+$ layer 12 adjacent the lower portion of the wafer remains. This exposes a portion of the p-type layer 11.

An n-type layer 13 is then arranged on the exposed portion of the layer 11. This n-type region may be gold-antimony, for example. The layer 13 may be deposited by an alloying step, for example.

As is also shown in FIG. 1*d*, the upper boundary portion of the thyristor device can be beveled off to produce the resulting structure shown in FIG. 1*d*. In this structure, the layer 13 is the cathode; the layer 11 is the gate region; the wafer 10 forms the base region; while the lower portion of the layer 11 together with the remaining portion of the layer 12 forms the anode region of the thyristor.

The concentration profile through the thyristor of FIG. 1*d* is shown in FIG. 2. The left-hand portion of the figure, indicated by the letter K is the cathode side of the thyristor; while the right-hand portion, indicated by the letter A, is the anode side of the thyristor. It can be seen that the concentration profile proceeds from the cathode side K through the cathode contact 5; the cathode region 13; the pn-junction 4 between the cathode and the gate regions; the pn-junction 3 between the gate and base regions; the pn-junction 2 between the base and anode regions; and the anode contact 1.

The concentration profile *b* in the gate region 11 between the pn-junctions 3 and 4 is shown to have a relatively uniform, slightly changing slope. Similarly, the concentration profile in the anode region adjacent the pn-junction 2 also has a relatively uniform, slightly changing portion *a*. This region *a* extends for a distance of a few microns. However, after this short distance from the pn-junction 2, the concentration profile in the anode region becomes much steeper and extends for a greater distance, indicated by the letter *a'*. It is clear that the sharply increasing concentration profile in the region *a'* is due to the $p^+$ layer 12 deposited during the gettering step by means of the boron-tri-bromide.

Furthermore, it can be seen in accordance wtih the principles of the present invention that the thickness of the gate region between the pn-junctions 3 and 4 is substantially smaller than the anode region between the contact 1 and the pn-junction 2.

It can be seen from FIG. 2 that the concentration profile in the anode region $A_p$ is substantially different from that produced by the processes of the prior art. In the arrangement of FIG. 2, the anode region $A_p$ has both a relatively flat portion *a* and a very steep portion *a'*. The relatively flat portion *a* corresponds substantially to the relatively flat portion *b* in the gate region between the pn-junctions 3 and 4.

In the prior art devices, the concentration profile in the anode region $A_p$ would appear as portion *a*, which would be equivalent to the portion *b* in the gate region. However, this is not optimum for the conductive conditions of the thyristor. The increased concentration in the anode region permits improved conduction properties for the thyristor.

It should be noted that, in order to produce the different concentration profile in the anode region $A_p$, it is necessary that the *a* portion of this anode region be produced by a process step that is different from the process step producing the gate region $B_p$. Since, in the prior art, both of these regions are produced at the same time, it is not possible to produce the different concentration profiles that are desired.

As indicated above, the separate process step produces the heavily doped $p^+$ region 12 only at the anode side $A_p$ of the thyristor. This provides excellent conductive properties for the thyristor, particularly in the region of the highest current carrying capacity.

As also indicated above, the process step for increasing the concentration profile and raising the surface concentration at the anode side is carried out with a gettering process. The gettering step improves the blocking properties of the pn-junction. The increased surface concentration likewise permits the selection of the best method of making contact to the anode region to provide the best conductive properties.

As mentioned above, halogen compound doped elements can be used appropriately as gettering material. For example, $PCl_5$ and $BBr_3$ as well as others may be used.

In order to optimize the electrical properties of the thyristor, many boundary or limiting conditions must be taken into consideration. For example, the n-doping of the initial silicon wafer and the remaining concentration of this layer after the carrying out of the various process steps effects the blocking capacity required for the thyristor. The smaller the doping of the base 10, the larger must the extent of this n-type layer be.

Other properties of the thyristor such as the temperature dependence of the blocking voltage in the positive direction and the permissible rate of potential increase with temperature, can be determined for the thyristor structure by use of an equivalent circuit diagram. Such an equivalent circuit diagram can include two current controlled feedback coupled transistors.

The above named properties depend essentially on the current amplification factors of the above mentioned equivalent circuit transistors. The current amplification factor of each of the equivalent transistors plays an important role for optimizing the structure of the thyristor. By the process incorporating the principles of the present invention, it is possible to correct otherwise unavoidable leakages by the process adjustment of the partial transistor which is formed by the cathode region, the gate region and the base region of the thyristor.

With the described method steps, it is possible to control the alloying process so that the gate region has the optimum concentration and thickness. The essential magnitude which can be varied is the current amplification factor of the above named partial transistors. By variation of the thickness and concentration of the gate region, two factors are simultaneously varied which affect the current amplification factor. These factors are the emitter efficiency and the transfer coefficient. These variation possibilities permit the broadest possible ranges most advantageously when a relatively flat curvature of the p-concentration profile is provided. It will be noticed that, in the structure of FIG. 1*d*, as indicated by the concentration profile of FIG. 2, the p-type profile in the gate region is relatively flat as is the corresponding region in the anode portion, evidenced by the portion *a* of the concentration profile in this region.

At the anode side of the thyristor, it is desirable to have the highest possible p-type concentration after a preselected distance from the pn-junction between the base and the anode. As was indicated before, in the prior art, the p-type concentrations of the anode region and the gate region are formed in the same process step. Therefore, they have the same concentration. On the other hand, as can be seen in the concentration profile of FIG. 2, after the desirable flat portion *a* of the profile in the anode region, a sharply increasing concentration *a'* has been provided by a gettering step in accordance with the principles of the present invention.

Furthermore, by using the halogen compound gettering step, it is possible to achieve a substantial improvement in the uniformity of the various layers deposited or otherwise arranged about the central silicon wafer. This can best be achieved by placing the silicon wafer in a drum which is rotated in a gas stream carrying the gettering substance. The silicon wafer is reciprocated during the gettering process on a statistical basis. Thus the surfaces of the silicon wafer are all freely exposed about the same time. By this uniform treatment, the conventional leakage or dispersions which are common in most diffusion processes are substantially eliminated. Also, if such a uniform yield is not necessary, it is possible to stack the wafers together and utilize a rocking mechanism, such as a vibrator, to achieve a relatively good uniform layer.

In carrying out the process, employing the principles of the present invention, it is also possible to use a series of epitaxial steps. This can advantageously be used for an n-type silicon layer and by the first epitaxial step the p-type layer is produced. The concentration characteristic of the p-type concentration can be chosen as desired by the epitaxial method. That is, in the extreme case, the p-concentration can be kept constant throughout the entire gate region. The successive addition of the p-doped region by epitaxial steps can produce the desired flat doping profile.

The second n-layer can, under normal circumstances, be produced by an alloying step or also by another epitaxial step wherein an n-type region is produced on the p-type gate region. The fabrication of the p-type layer in the anode region can be carried out as described above in accordance with the principles of the present invention. For example, this can advantageously be done wherein the first part of the p-type anode layer extends for a few microns in a substantially flat manner with increasing thickness. In extreme cases, a constant p-type doping can be achieved. Finally, on top of this layer, the doping concentration is substantially increased so that the final heavily doped p-type zone is produced.

By use of planar techniques, not only can a thyristor device be produced from the silicon wafer, but also apparatus can be produced wherein the thyristor device is just a single element of the entire structure. It also should be evident that, instead of an n-type silicon wafer, a p-type wafer can be used for starting purposes.

As mentioned above, the principles of the present invention can be advantageously practiced wherein the four-layered structure of the thyristor is only one part of the overall device. Such a structure is known as the Triac. In such an arrangement, two anti-parallel connected four-layer structures are provided.

It will be understood that the above description of the present invention is susceptible to various modifications, changes and adaptations, and the same are intended to be comprehended within the meaning and range of equivalents of the appended claims.

What is claimed is:

1. In a method for producing a thyristor, starting with a wafer of semiconductor material having a first conductivity, the steps comprising:

(1) arranging a first layer of conductivity opposite to said first conductivity on the surfaces of said wafer;

(2) arranging a second layer of said opposite conductivity on said first layer, said second layer having a substantially heavier doping than said first layer;

(3) removing part of said second layer to leave an exposed portion of said first layer; and (4) arranging a third layer of material of said first conductivity on said exposed portion of said first layer.

2. A method for producing a thyristor as defined in claim 1 wherein said wafer of semiconductor material forms the base region of the thyristor, said first layer forms the gate region of the thyristor along one major surface portion of said wafer and also forms a portion of the anode region of the thyristor along a second major surface portion of said wafer, said second layer of heavier doped material forms the remainder of said anode region and wherein said third layer of material of said first conducivity forms the cathode of the thyristor.

3. A method as defined in claim 1 wherein a gettering step is carried out at the same time said second layer is arranged on said first layer.

4. A method as defined in claim 3 wherein said gettering step is carried out using a halogen compound.

5. A method as defined in claim 4 wherein said semiconductor material is silicon and the halogen compound is arranged in a carrier gas which is passed over the silicon wafer after the silicon wafer is heated.

6. A method as defined in claim 5 characterized in that the carrier gas is inert.

7. A method as defined in claim 1 wherein said semiconductor material is silicon and the wafer is uniformly exposed to the action of a halogen compound in order to avoid non-homogeneous depositions on the wafer and non-homogeneous localizations of the wafer.

8. A method as defined in claim 4 wherein the halogen compound is a boron-tri-bromide.

References Cited

UNITED STATES PATENTS

| | | | |
|---|---|---|---|
| 3,180,755 | 4/1965 | Reinitz | 148—189 |
| 3,217,378 | 11/1965 | Reuschel et al. | 317—235 |
| 3,278,347 | 10/1966 | Topas | 317—235 |
| 3,307,240 | 3/1967 | Ginsbach et al. | 317—235 |
| 3,312,880 | 4/1967 | Longo et al. | 317—235 |
| 3,327,183 | 6/1967 | Greenberg et al. | 317—235 |
| 3,337,782 | 8/1967 | Todaro | 317—235 |
| 3,337,783 | 8/1967 | Stehney | 317—235 |
| 3,362,858 | 1/1968 | Knopp | 317—235 |
| 3,366,851 | 1/1968 | Herlet et al. | 317—235 |

L. DEWAYNE RUTLEDGE, Primary Examiner

R. A. LESTER, Assistant Examiner

U.S. Cl. X.R.

148—174, 186, 187, 188